United States Patent
Tanaka et al.

(10) Patent No.: US 7,122,096 B2
(45) Date of Patent: Oct. 17, 2006

(54) METHOD AND APPARATUS FOR PROCESSING SEMICONDUCTOR

(75) Inventors: Junichi Tanaka, Tsuchiura (JP);
Hiroyuki Kitsunai, Chiyoda (JP);
Hideyuki Yamamoto, Kudamatsu (JP);
Akira Kagoshima, Kudamatsu (JP);
Daisuke Shiraishi, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 135 days.

(21) Appl. No.: 10/377,824

(22) Filed: Mar. 4, 2003

(65) Prior Publication Data

US 2004/0175849 A1    Sep. 9, 2004

(51) Int. Cl.
*H01L 21/00* (2006.01)
*C23C 16/004* (2006.01)

(52) U.S. Cl. .................... 156/345.24; 156/345.25; 156/345.26; 156/345.27; 118/712; 118/708; 204/192.1; 204/298.01

(58) Field of Classification Search .......... 156/345.24, 156/345.25, 345.26, 345.27; 118/712, 708; 204/192.1, 298.1, 298.01
See application file for complete search history.

(56) References Cited

U.S. PATENT DOCUMENTS

| 4,927,485 A | * | 5/1990 | Cheng et al. | .......... 156/345.25 |
| 2003/0003607 A1 | * | 1/2003 | Kagoshima et al. | .......... 438/14 |

FOREIGN PATENT DOCUMENTS

| JP | A-6-132251 | 5/1994 |
| JP | A-10-125660 | 5/1998 |
| JP | A-2001-267232 | 9/2001 |

* cited by examiner

*Primary Examiner*—Ram N. Kackar
(74) *Attorney, Agent, or Firm*—Antonelli, Terry, Stout and Kraus, LLP.

(57) ABSTRACT

In a semiconductor processing apparatus including a process chamber, a sample stand for holding a sample in the process chamber, and a process gas supply unit for supplying a process gas to the process chamber, a plurality of samples of a lot are successively supplied to a process chamber to be successively processed in an intra-lot successive process. The apparatus includes a state sensor for detecting a state in the process chamber and an intra-lot variation pattern prediction unit for predicting, according to sensor data detected by the state sensor, intra-lot variation patterns of results of the intra-lot successive process. According to a result of the prediction by the intra-lot variation pattern prediction unit, the apparatus changes a process condition applied to a sample of the lot.

8 Claims, 6 Drawing Sheets

METHOD AND APPARATUS FOR PROCESSING SEMICONDUCTOR

BACKGROUND OF THE INVENTION

The present invention relates to a method and an apparatus for processing a semiconductor, and in particular, to a method and an apparatus for successively processing a semiconductor.

Semiconductor devices are produced in fine dimensions these days, and hence higher dimensional precision is required in the machining of the semiconductor devices. A semiconductor processing apparatus conducts physico-chemical machining on a semiconductor wafer using heat and/or plasma. In such a processing apparatus, a product resultant from chemical reaction in the apparatus piles as a residual product on an inner wall of the apparatus. The residual product increases with a lapse of time, and a state to process wafers gradually changes as a result.

That is, while the operation to process the wafer is repeatedly executed, the state of machining the semiconductor device changes and performance of the semiconductor device is resultantly deteriorated.

To solve the-problem, the product piled on the inner wall of a processing chamber is cleaned ordinarily using plasma. However, the plasma cleaning cannot completely remove the product piled on the inner wall of the processing chamber. Therefore, as described above, while the operation to process the wafer is repeatedly executed, thickness of a layer of the product piled on a part of the inner wall of the chamber gradually increases and hence a contour of machining the semiconductor device gradually changes. Therefore, before the change in the machining contour becomes a problem, constituent components or parts of the semiconductor processing apparatus are replaced or cleaned in ordinary cases.

In addition to the pile of the product, variations in various states of the processing apparatus also contribute to the variation in the machining contour of the wafer. To cope with this problem, attempts have been conducted. For example, a plasma processing apparatus senses a change in an internal state thereof and feeds a result of the sensing operation to a process condition of the plasma processing apparatus to keep a process characteristic at a fixed level.

For example, JP-A-6-132251 (article 1) describes an etch processing apparatus or an etching apparatus which monitors a result of etching for each wafer to determine whether or not the monitored result satisfies an inspection condition. If the result does not satisfy the condition, the etching apparatus modifies the process condition to restore the process characteristic.

JP-A-10-125660 (article 2) describes a plasma processing apparatus which measures an electric signal reflecting a state of plasma while processing a sample. According to a value of the signal thus measured, the apparatus calculates a predicted value of a plasma process characteristic and diagnoses the plasma state according to the predicted value.

JP-A-2001-267232 (article 3) describes a method in which monitored data of results of wafer process and process states in the past are stored in a database. According to monitored data of the wafer, a result of process of a wafer at present is predicted to conduct optimization control for the process.

SUMMARY OF THE INVENTION

However, in the methods of articles 1 to 3 described above, a process state of a particular wafer is monitored to predict variation in a result of wafer machining operation according to data thus monitored to control the process condition of a subsequent wafer using the predicted variation. In consequence, when the machining result of the particular wafer used for the prediction is not equal to that of the subsequent wafer, the methods cannot optimize the process.

For example, assume that when the process condition is kept unchanged, a machining dimension of the particular wafer is excessive and a machining dimension of the subsequent wafer is appropriate. In this case, if the process condition is controlled to reduce the machining dimension of the subsequent wafer on the basis of the monitored result that the machining dimension of the particular wafer is excessive, the machining dimension of the subsequent wafer, which would inherently lead to a normal machining result, becomes less than a normal value. That is, in a processing apparatus in which the process result (machining result) varies with a lapse of time when the process is repeatedly conducted, the optimal process result cannot be obtained in the method in which a process state of a particular wafer is monitored and variation in a process result is predicted according to data thus monitored to control a process condition of a subsequent wafer.

Description will now be given of an apparatus and a method for processing a semiconductor capable of solving the problems of the prior art.

Description will be given of an apparatus and a method for processing a semiconductor capable of obtaining a process result at a fixed level even when a process result of the processing apparatus varies with a lapse of time.

According to the present invention, there is provided an apparatus for processing a semiconductor in which a plurality of samples of a lot are successively supplied to a process chamber and are successively processed in an intra-lot successive process. The apparatus includes a process chamber, a sample stand for holding a sample in the process chamber, a process gas supply unit for supplying a process gas to the process chamber, a state sensor for detecting a state in the process chamber, and an intra-lot variation pattern prediction unit for predicting, according to sensor data detected by the state sensor, intra-lot variation patterns of results of the intra-lot successive process. According to a result of the prediction by the intra-lot variation pattern prediction unit, the apparatus changes a process condition applied to a sample of the lot.

Other objects, features and advantages of the invention will become apparent from the following description of the embodiments of the invention taken in conjunction with the accompanying drawings.

DESCRIPTION OF THE EMBODIMENTS

Figure 1:
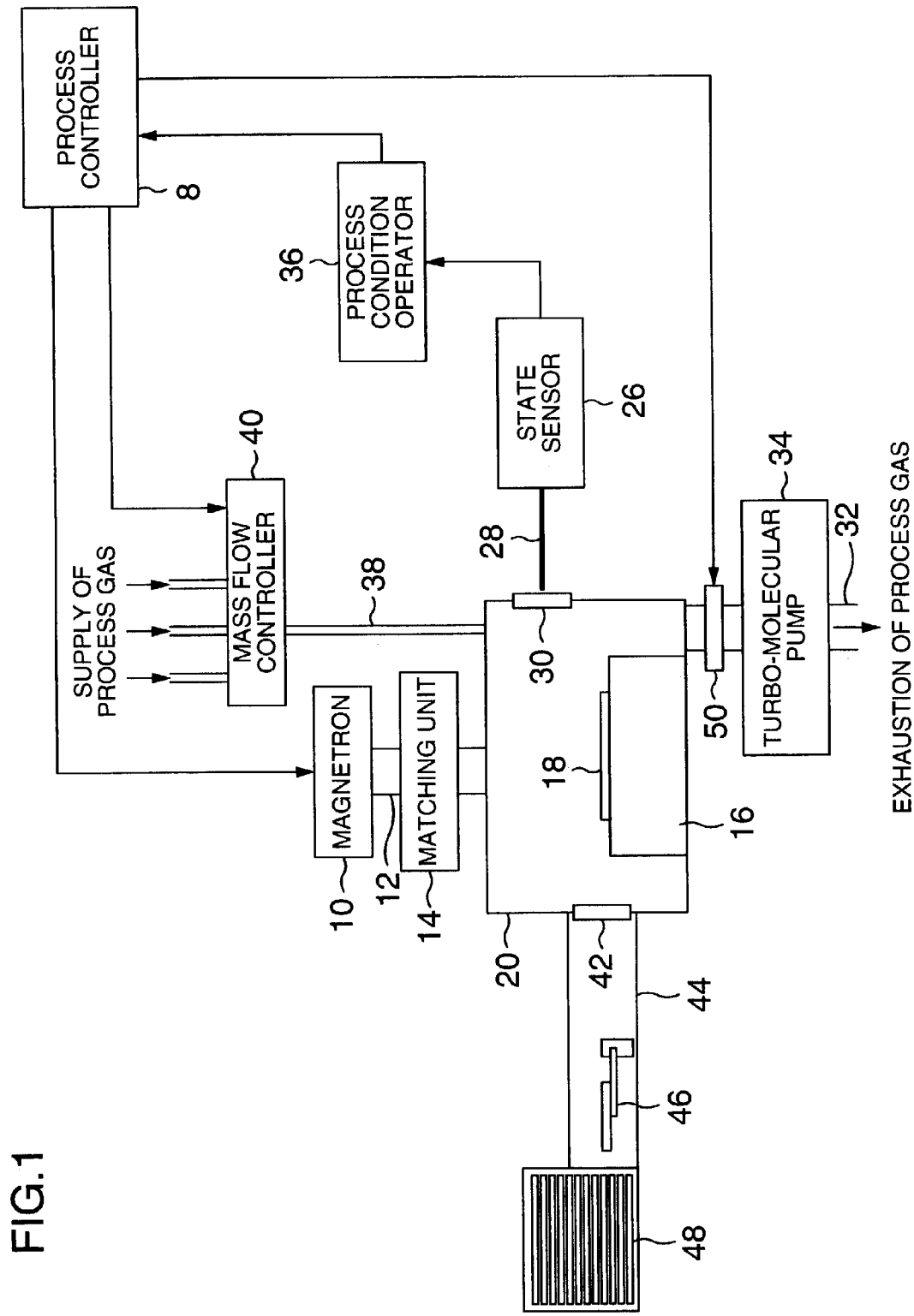
FIG. 1 is a diagram to explain an embodiment of a semiconductor processing apparatus according to the present invention.

Next, description will be given of an embodiment of the present invention by referring to the accompanying drawings. FIG. 1 is a diagram to explain an embodiment of a semiconductor processing apparatus according to the present invention. In conjunction with FIG. 1, description will be given of a plasma etching apparatus as an example of the semiconductor processing apparatus. In FIG. 1, a numeral 8 indicates a process controller to control the entire apparatus. The controller 8 receives an optimal process condition from a process condition setting unit, which will be described later, and controls respective constituent components of the apparatus according to the received process condition. A numeral 10 is a magnetron to generate a microwave, a numeral 12 is a waveguide to transmit the microwave generated by the magnetron 10 to a process chamber 20, a numeral 14 is an impedance matching unit disposed between the waveguide 12 and the process chamber 20, a numeral 16 is a sample stand to hold a sample 18 in the process chamber 20, a numeral 18 is a sample such as a wafer, and a numeral 20 is a process chamber to generate plasma therein.

A numeral 26 is a state sensor to detect an internal state of the process chamber 20, and is possibly, for example, a spectrometer to sense light emission of plasma. A numeral 28 is an optical fiber to feed the light emitted from the plasma via a window 30 to the state sensor 26, the window 30 being used to externally observe the light emission of plasma. A numeral 32 is an exhaust pipe to discharge process gas from the process chamber (20), a numeral 34 is a turbo-molecular pump to discharge process gas, and a numeral 36 is a process condition setting unit which receives a spectrum of plasma light emission from, for example, a spectrometer constituting the state sensor 26 to predict a variation pattern of a wafer machining contour in a lot according to a distribution of the spectrum to obtain an optimal process condition for each wafer of the lot according to the variation pattern.

A numeral 38 is a gas supply pipe to feed process gas to the process chamber 20, a numeral 40 is a mass flow controller to control flow rates of process gases of various types, a numeral 42 is a sample gate which opens to transport a sample 18, a numeral 44 is a load lock chamber, a numeral 46 is a sample transport arm to transport a sample, and a numeral 48 is a lot holding cassette to store, for example, a lot of samples. In this connection, the semiconductor processing apparatus desirably includes a plurality of lot holding cassettes. A numeral 50 is a pressure controller to control gas pressure in the process chamber (20).

The process gas and the like in the process chamber 20 are discharged by the turbo-molecular pump 34 to keep a low pressure in the process chamber 20. In this state, when a microwave is fed to the process chamber 20, plasma of the process gas is generated therein. The plasma is used to machine a semiconductor device on a surface of the sample 18. In some cases, a high-frequency bias voltage is applied to the sample stand 16 to move or to draw the plasma toward the sample 18.

In the description, a semiconductor wafer is used as an example of the sample 18. However, in addition to a semiconductor wafer, fine structures such as a liquid-crystal display panel and a micro-electro-mechanical system (MEMS) can also be used as objects of the machining. Additionally, a semiconductor processing apparatus using microwave plasma is employed as an example of the semiconductor processing apparatus in the description. However, another semiconductor processing apparatus such as a parallel plate radio frequency (RF) plasma processing apparatus, an ICP plasma processing apparatus, or a helicon plasma processing apparatus can be used. Moreover, a spectrometer to detect a plasma state is used as an example of the state sensor to detect an internal state of the process chamber in the description. However, as the state sensor, it is also possible to use another sensor, for example, an impedance monitor or a plasma probe to measure electric characteristics of plasma such as a voltage and a current supplied to a plasma generator, phase differences of the voltage and the current, and RF components of the voltage and the current; or an infrared or luminescence thermometer. To correctly determine the internal state of the processing apparatus, it is desirable to obtain possibly many kinds and possibly much monitored data by various types of sensors.

Figure 2:
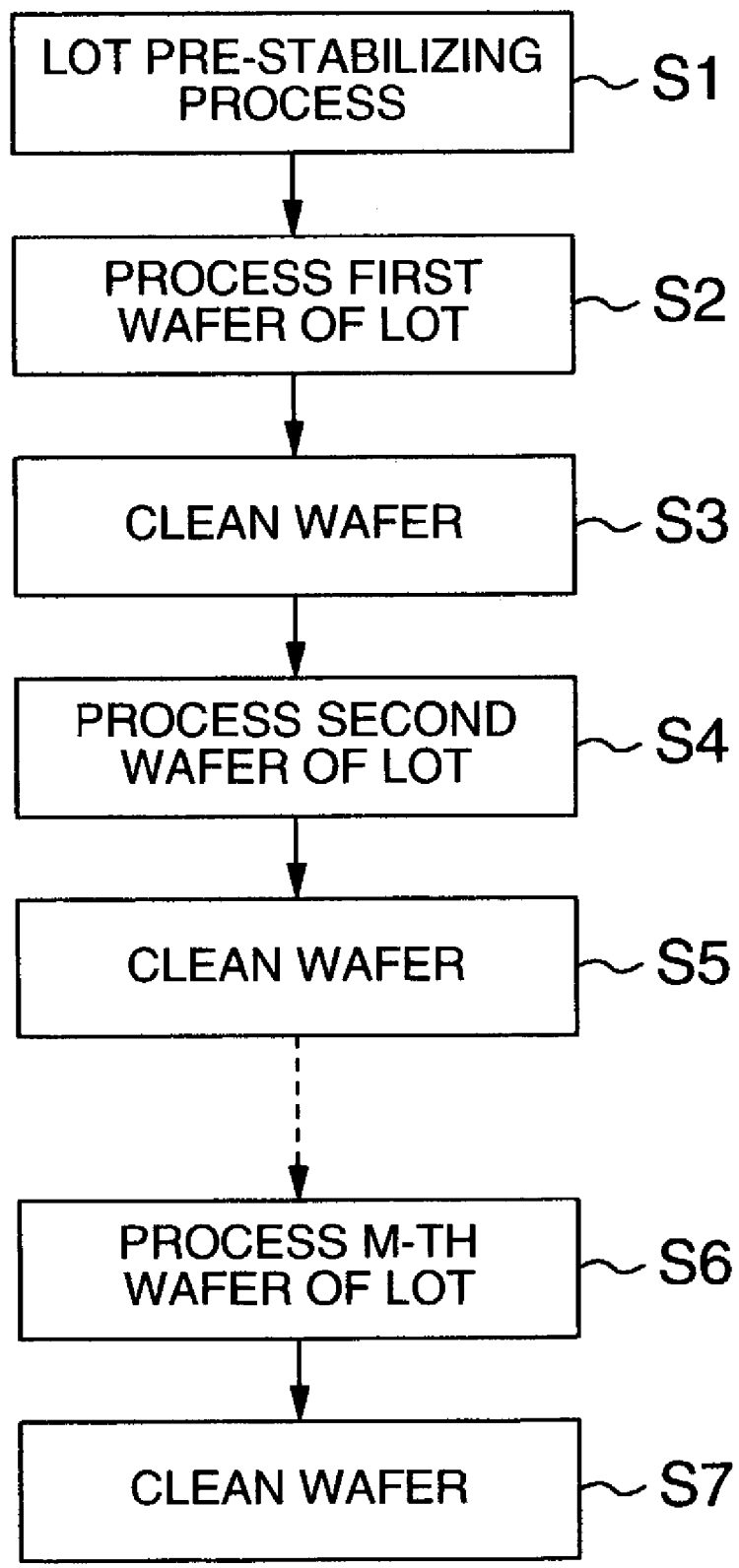
FIG. 2 is a flowchart to explain intra-lot successive processing in a semiconductor processing apparatus.

FIG. 2 is a diagram to explain an intra-lot successive process of the semiconductor processing apparatus. Ordinarily, the apparatus has a function to successively process all or part of wafers stored in a lot holding cassette 48 to improve throughput of the apparatus. This successive process is called an intra-lot successive process.

Before the intra-lot successive process, a lot pre-stabilizing process is conducted to adjust the state of the wall of the plasma chamber to obtain a stable machining contour. The lot pre-stabilizing process includes a process step called "cleaning" to remove a layer or film of a substance piled on the inner wall of the plasma chamber 20 or a process step called "seasoning" to modify the wall state of the plasma chamber (20; step S1).

Next, a first wafer of the lot is processed. After the first wafer is processed, a product resultant from the wafer process piles on the inner wall of the plasma chamber 20. Therefore, to remove the piled layer, a wafer cleaning step is conducted for each wafer process (steps S2 to S7).

The lot pre-stabilizing process (step S1) may be carried out under the same process condition as for the wafer cleaning process (step S3). The intra-lot successive process is ordinarily conducted only for a group of wafers constituting devices which are the same to each other.

Figure 3:
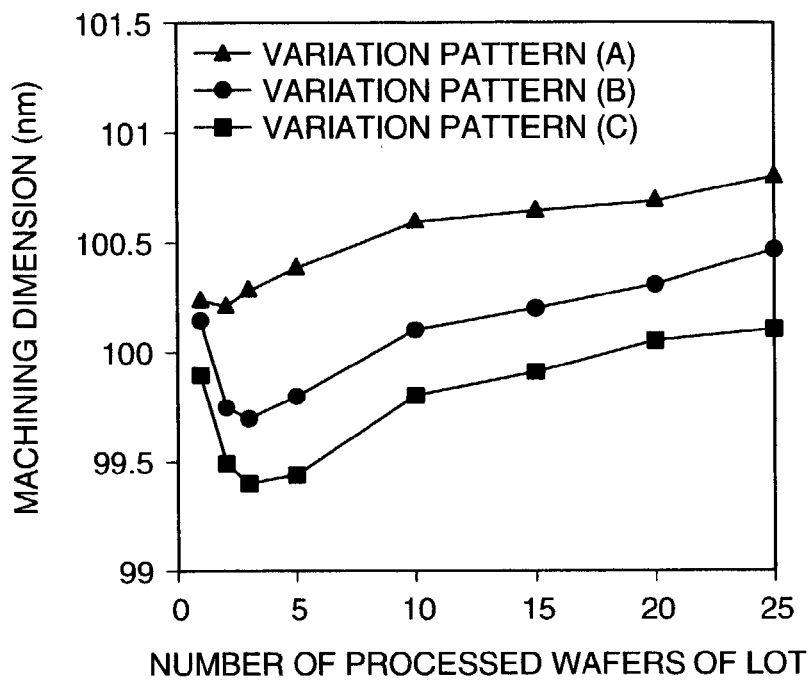
FIG. 3 is a graph showing distributions of a machining dimension of wafers.

FIG. 3 is a diagram showing distributions of a machining dimension of wafers.

As described above, the process chamber 20 is stabilized before the intra-lot successive processing. Next, using the process chamber, a plurality of wafers are successively processed to manufacture devices which are the same to each other. Resultantly, the machining results of the wafers of the lot do not vary in a random way but have particular variation patterns.

The variation patterns will be described for an example of etching of gate electrodes of a complementary metal-oxide semiconductor (CMOS) transistor. First, using a mixture of HBr, $Cl_2$, and $O_2$ as a process gas, a wafer with a gate machining mask pattern copied thereon is processed by plasma etching. Width of each gate electrode after plasma etching is a most important item of management to determine performance of the device and is set as a machining dimension to be monitored. FIG. 3 shows intra-lot variation patterns of the machining contour obtained as a result of a process by a plasma etching apparatus. Incidentally, one lot includes 25 wafers in this example.

In FIG. 3, variation pattern (A) is a variation pattern obtained immediately after the plasma etching apparatus is wet cleaned. Variation pattern (B) is a variation pattern obtained at a point of time when about 500 wafers are processed after the wet cleaning. Variation pattern (C) is a variation pattern obtained at a point of time when about 5000 wafers are processed immediately before next wet cleaning.

In this way, when the wafer process is repeatedly conducted after the wet cleaning, the intra-lot variation pattern varies from the pattern (A) to the pattern (B) and then from the pattern (B) to the pattern (C). The progress of transition is not monotonous in proportion to the number of wafers thus processed but changes according to various factors such as a type of the device to be manufactured and an interval of time between the lots. For example, in a case in which the wafer process is not conducted at all for some reasons of the production line and the plasma chamber is kept unused for a long period of time after a vacuum exhaust process thereof, a reverse transition from the variation pattern (B) to the variation pattern (C) takes place in some cases. Therefore, the variation pattern cannot be simply predicted according to the number of wafers processed after the wet cleaning.

Figure 4:
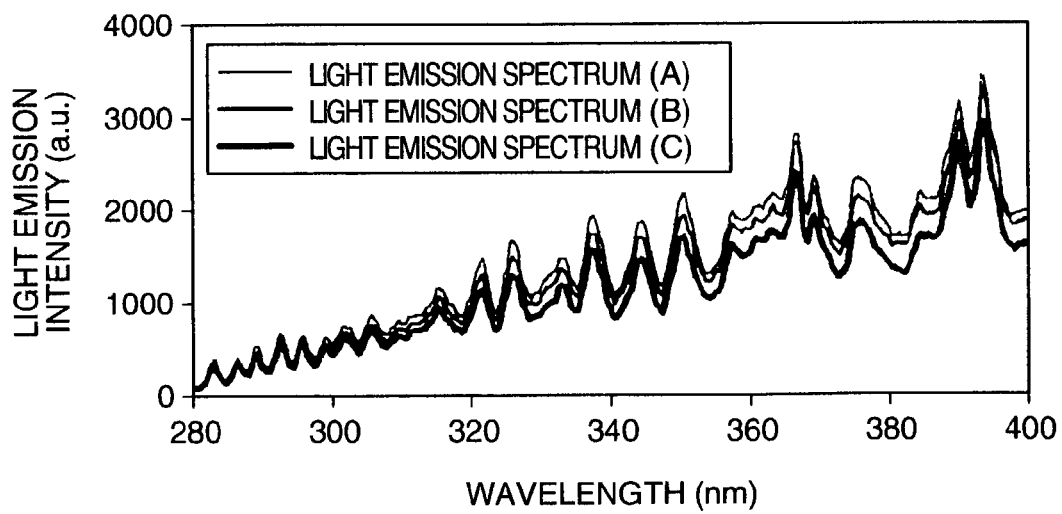
FIG. 4 is a graph showing light emission spectra obtained by a lot pre-stabilizing process.

FIG. 4 is a graph showing light emission spectra obtained by a lot pre-stabilizing process (step S1).

According to experiments conducted by the inventors of the present invention, a correlation exists between waveforms of light emission spectra obtained in the lot pre-stabilizing process and intra-lot variation patterns of the machining contour. FIG. 4 shows examples of light emission spectral waveforms in the lot pre-stabilizing process which have a correlation with the intra-lot variation patterns shown in FIG. 3. Light emission spectral waveforms (A), (B), and (C) shown in FIG. 4 respectively correspond to the variation patterns (A), (B), and (C).

Consequently, a variation pattern of intra-lot machining contour can be predicted using the light emission spectral waveforms shown in FIG. 4.

It rarely occurs that a waveform of a light emission spectrum completely matches the light emission spectral waveform (A), (B), or (C). Similarly, it rarely occurs that an intra-lot variation pattern completely matches the variation pattern (A), (B), or (C). An intermediate state occurs in many lots. Therefore, it is required to calculate an intra-lot variation patter in an intermediate state through interpolation using a light emission spectral waveform in an intermediate state.

The calculation process will now be described. Sensor data such as light emission spectral data having a plurality of data items (of intensity of light emission) for each wavelength can be expressed using vectors. Therefore, an intermediate state of the vectors can be calculated using a concept of distance of the vector. For example, assume that a light emission spectrum has data items for M pixels. The light emission spectra (A), (B), and (C) can be expressed as follows.

$$s_A = \begin{pmatrix} I_1^A \\ I_2^A \\ I_3^A \\ \vdots \\ I_M^A \end{pmatrix} \quad s_B = \begin{pmatrix} I_1^B \\ I_2^B \\ I_3^B \\ \vdots \\ I_M^B \end{pmatrix} \quad s_C = \begin{pmatrix} I_1^C \\ I_2^C \\ I_3^C \\ \vdots \\ I_M^C \end{pmatrix} \quad (1)$$

Each vector component I is light emission intensity for an associated frequency. The wavelength corresponding to each element is expressed using vectors as follows.

$$\Lambda = \begin{pmatrix} \lambda_1 \\ \lambda_2 \\ \lambda_3 \\ \vdots \\ \lambda_M \end{pmatrix} \quad (2)$$

In the graph of light emission spectral data of FIG. 4, the wavelength $\lambda$ and the light emission intensity I are shown along the abscissa and the ordinate, respectively. Moreover, distance between two light emission spectra $S_A$ and $S_B$ is expressed as $l_{ab}$, and $l_{ab}$ is calculated, for example, as follows.

$$l_{AB} = s_A \cdot s_B = \sum_{k=1}^{M} I_k^A I_k^B \quad (3)$$

Next, the intra-lot variation pattern of machining contour is expressed using vectors. Assume that the intra-lot variation patterns (A), (B), and (C) are represented as vectors $\Delta_A$, $\Delta_B$, and $\Delta_C$, respectively. The vectors $\Delta_A$, $\Delta_B$, and $\Delta_C$ are then expressed as follows.

$$\Delta_A = \begin{pmatrix} \delta_1^A \\ \delta_2^A \\ \delta_3^A \\ \delta_5^A \\ \delta_{10}^A \\ \delta_{15}^A \\ \delta_{20}^A \\ \delta_{25}^A \end{pmatrix} \quad \Delta_S = \begin{pmatrix} \delta_1^B \\ \delta_2^B \\ \delta_3^B \\ \delta_5^B \\ \delta_{10}^B \\ \delta_{15}^B \\ \delta_{20}^B \\ \delta_{25}^B \end{pmatrix} \quad \Delta_C = \begin{pmatrix} \delta_1^C \\ \delta_2^C \\ \delta_3^C \\ \delta_5^C \\ \delta_{10}^C \\ \delta_{15}^C \\ \delta_{20}^C \\ \delta_{25}^C \end{pmatrix} \quad (4)$$

In expression (4), a symbol $\delta_i^j$ is a quantity of machining dimension variation of an i-th wafer of a lot for an intra-lot variation pattern (j). As can be seen from expression (4) and FIG. 3, it is not required that the vector of the intra-lot variation pattern covers all wafers of the lot. The variation of the wafer not associated with expression (4) and FIG. 3 can be calculated through interpolation using variations in the machining dimensions of wafers sandwiching the pertinent wafer.

For example, assume that a light emission spectrum obtained during the lot pre-stabilizing process in an intra-lot successive process is expressed as $S_D$. First, distance $l_{AD}$ between the vector $S_D$ and the vector $S_A$ representing the light emission spectrum (A), distance $l_{BD}$ between the vector $S_D$ and the vector $S_B$ representing the light emission spectrum (B), and distance $l_{CD}$ between the vector $S_D$ and the vector $S_C$ representing the light emission spectrum (C) are respectively calculated.

Next, two vectors less apart from the vector $S_D$ are selected. Assume that, for example, the vectors $S_A$ and $S_B$ are selected in this case. For the lot, the intra-lot variation pattern can be calculated as follows.

$$\Delta_D = \frac{l_{BD}\Delta_A + l_{AD}\Delta_B}{l_{AD} + l_{BD}} \quad (5)$$

In the example, the calculation method uses three variation patterns. However, even if the number of variation patterns is two or more than three, the intra-lot variation pattern can be calculated using expressions (3) and (5).

The light emission spectrum shown in FIG. 4 represents mean values of light emission spectral data obtained during last several seconds of the lot pre-stabilizing process. In this connection, a light emission spectrum of mean values of the overall lot pre-stabilizing process can also be employed as the light emission spectrum. Also, when the lot pre-stabilizing process is a successive process of cleaning and seasoning, it is favorable to use a spectrum of the difference between a light emission spectrum obtained during first several seconds of the seasoning and a light emission spectrum obtained during last several seconds of the seasoning for the following reasons. That is, the light emission spectrum obtained during first several seconds of the seasoning is a light emission spectrum representing a state of an inner wall of a clean plasma chamber from which the piled layer is removed by the previous cleaning. By using the difference between the light emission spectrum and the light emission spectrum obtained during last several seconds of the seasoning in the stabilized inner wall of the plasma chamber, a dynamic behavior of the inner wall of the chamber can be monitored.

Figure 5:
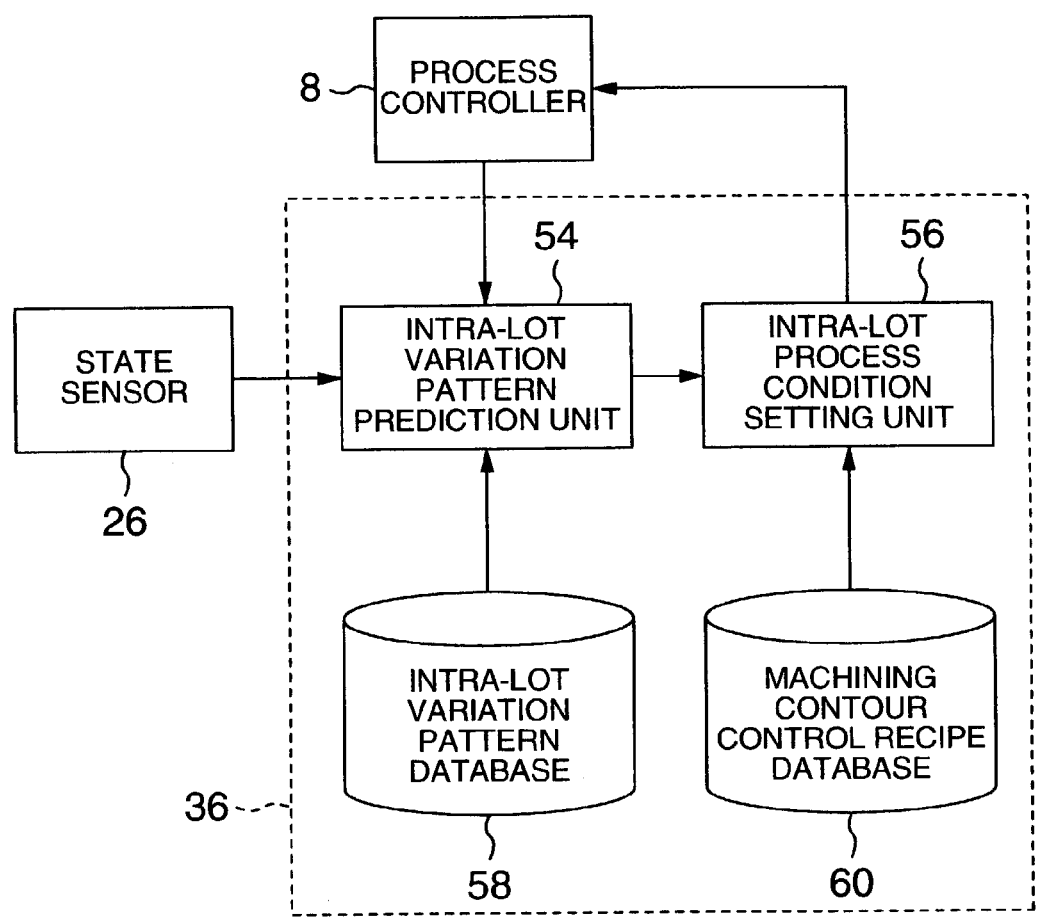
FIG. 5 is a diagram to explain a process condition setting unit.

FIG. 5 is a diagram to explain a process condition setting unit. In FIG. 5, a numeral 54 is an intra-lot variation pattern prediction unit which receives an indication from the process controller 8 and a necessary light emission spectrum from a spectrometer during the lot pre-stabilizing process. Using the light emission spectrum from the state sensor 26, the prediction unit 54 refers to an intra-lot variation pattern database 58 to predict an intra-lot variation pattern for a lot to be processed. According to the predicted variation pattern, the prediction unit 54 calculates a machining dimension variation for each wafer of the lot and delivers the machining dimension variation to an intra-lot process condition setting unit 56.

A numeral 58 indicates an intra-lot variation pattern database to store the vectors of light emission spectral waveforms $S_A$, $S_B$, and $S_C$ and the vectors of intra-lot variation patterns $\Delta_A$, $\Delta_B$, and $\Delta_C$ with a correspondence established therebetween.

A numeral 56 is an intra-lot process condition setting unit which refers to a machining contour control recipe database 60 to calculate a quantity of correction of a process condition for each wafer to transmit an optimal process condition of each wafer to the process controller 8. A numeral 60 is a machining contour control recipe database to store a quantity of correction of the machining contour and a quantity of correction of a process condition (recipe) required to obtain the quantity of correction of the machining contour.

Figure 6:
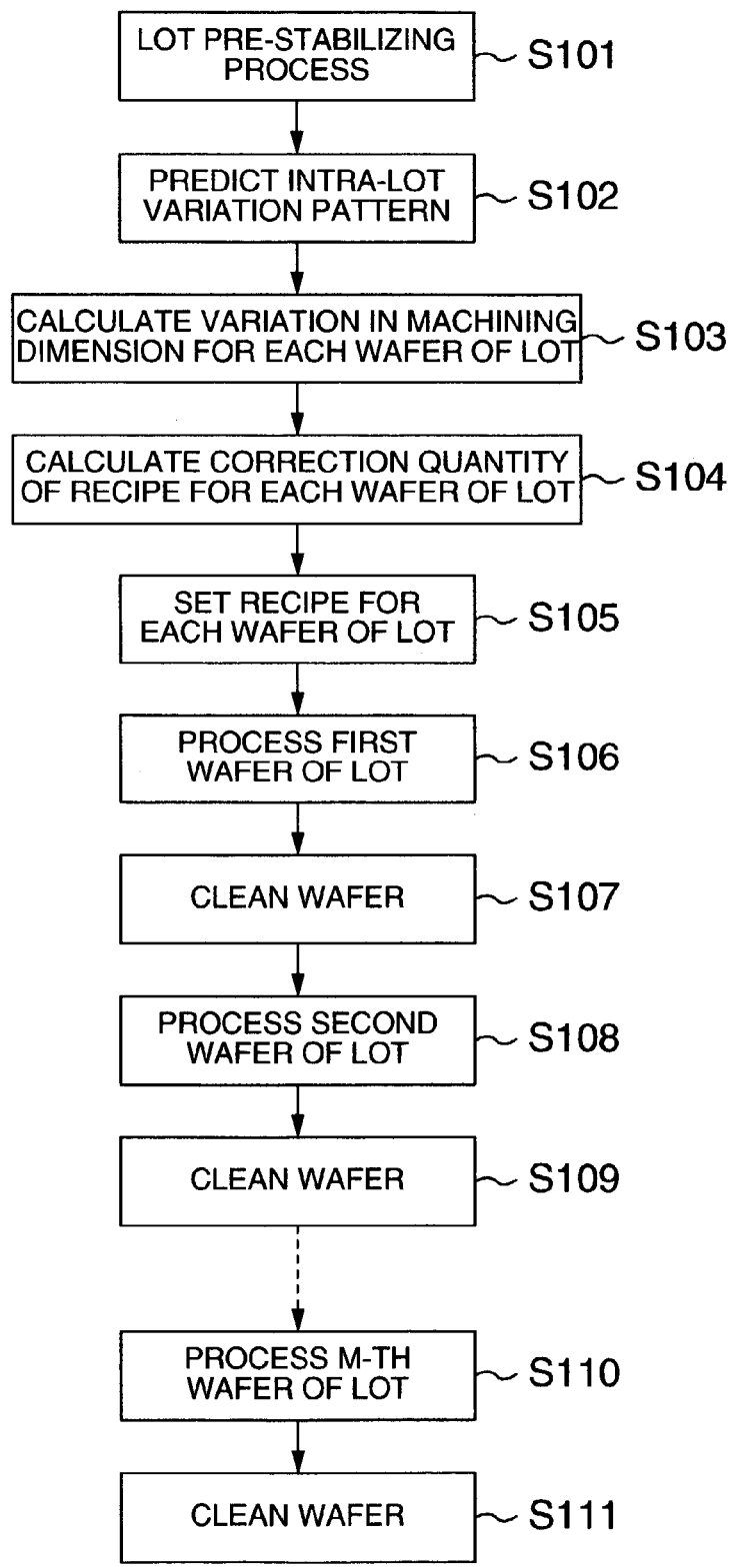
FIG. 6 is a diagram to explain a process in the process condition setting unit.

FIG. 6 is a flowchart to explain processing of the process condition setting unit. First, before the intra-lot successive process, the lot pre-stabilizing process is conducted to adjust the wall state of the plasma chamber to obtain a stable machining contour. As the lot pre-stabilizing process, the cleaning or seasoning process is performed (step S101).

Next, according to the light emission spectrum obtained from the state sensor 2, the intra-lot variation prediction unit 54 refers to the intra-lot variation pattern database 58 6 to predict an intra-lot variation pattern of the pertinent lot. According to the predicted variation pattern, the prediction unit 54 then calculates a variation of the machining dimension for each wafer of the lot to deliver the calculated variation to the intra-lot process condition setting unit 56 (steps S102 and S103).

Subsequently, using the received variation, the condition setting unit 56 refers to the recipe database 60 to calculate a quantity of correction of a process condition for each wafer and then transmits an optimal process condition (recipe) of each wafer to the process controller 8 (steps S104 and S105).

Next, the process controller 8 receives the optimal process condition and then starts the intra-lot successive process under the received process condition (steps S106 to S111).

According to this method, the recipe is beforehand determined for each wafer of the lot when the intra-lot successive process is started, and hence a stable control operation can be conducted at a high speed.

Figure 7:
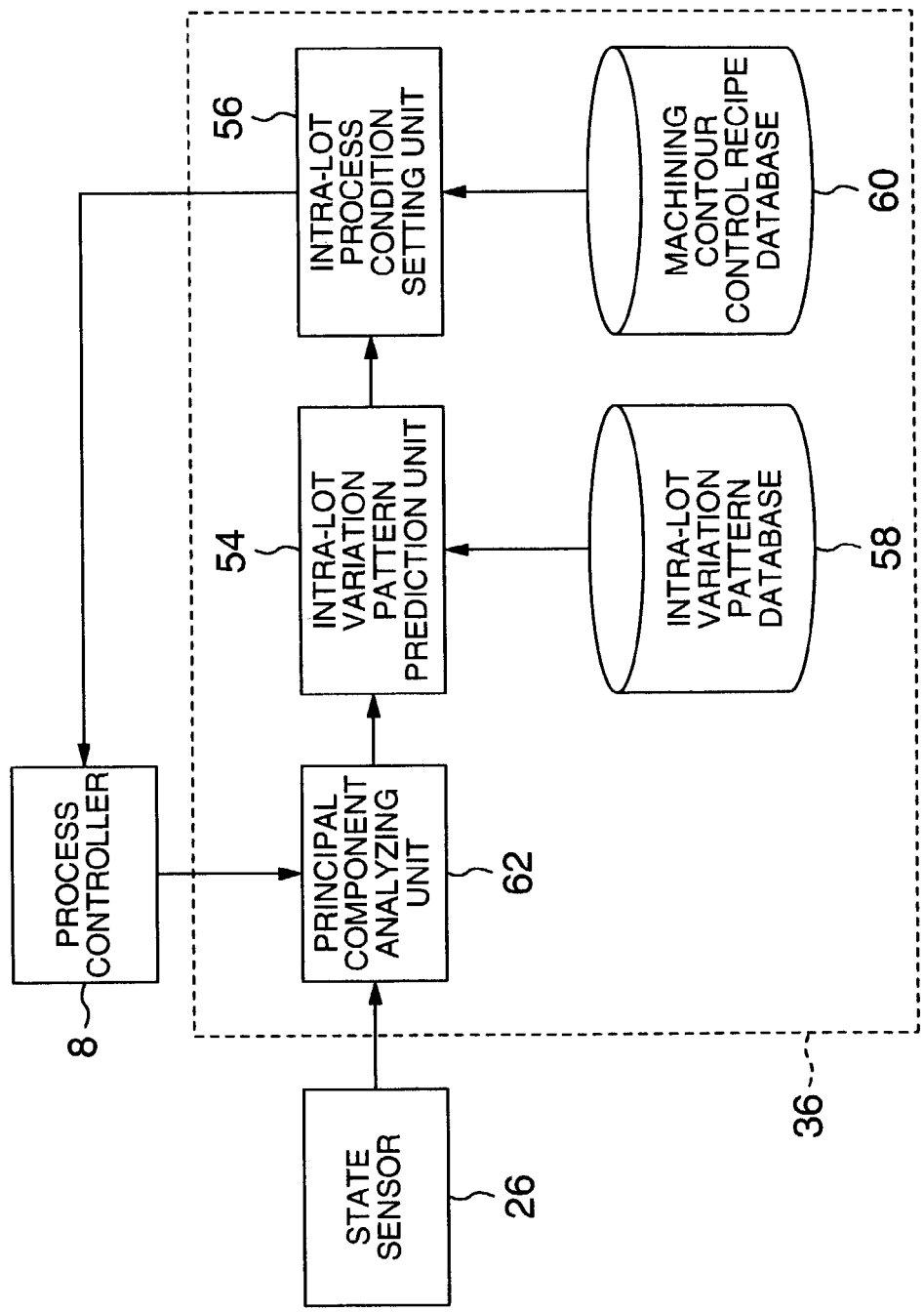
FIG. 7 is a diagram to explain another embodiment.

FIG. 7 is a diagram to explain another embodiment. As can be seen from the example described above, in the calculation to obtain through interpolation an intra-lot variation pattern in an intermediate state using a light emission spectral waveform in an intermediate state, the distance between the light emission spectra is used. However, in the embodiment, a principal component analysis is conducted to determine similarity of light emission spectra according to principal component scores. In FIG. 7, a numeral 62 is a principal component analyzing unit which conducts a principal component analysis using the vectors of light emission spectral waveforms $S_A$, $S_B$, $S_C$, and $S_D$ to generate principal component score vectors. A numeral 54' is an intra-lot variation pattern prediction unit which refers to the intra-lot variation pattern database 58 according to the principal component score vectors to predict an intra-lot variation pattern in a lot to be processed. According to the predicted intra-lot variation pattern, the prediction unit 54' calculates a machining dimension variation of each wafer of the lot and delivers the calculated variation to the intra-lot process condition setting unit 56. In this connection, the same constituent components as those shown in FIG. 5 are assigned with the same reference numerals, and description thereof will be avoided.

First, the process controller 8 indicates to the principal component analyzing unit 62 timing to acquire a light emission spectrum during the lot pre-stabilizing process from the state sensor 26. The analyzing unit 62 conducts a principal component analysis according to a vector $S_D$ of a light emission spectral waveform received from the state sensor and the vectors $S_A$, $S_B$, and $S_C$ of light emission spectral waveforms obtained from the intra-lot variation pattern database to generate principal component score vectors. Assume that the generated vectors are $P_n^A$, $P_n^B$, $P_n^C$, and $P_n^D$. The intra-lot variation pattern can be predicted using a particular number of principal component scores. However, in this case, description will be given of a method to use first and second principal components. Therefore, the principal score vectors are two-dimensional vectors.

The principal component analyzing unit 62 then sends the principal score vectors to the prediction unit 54. Using expression (3) defining the distance between vectors, the prediction unit 54 calculates distance $L_{AD}$ between the principal component score vectors $P_n^D$ and $P_n^A$, distance $L_{BD}$ between the principal component score vectors $P_n^D$ and $P_n^B$, and distance $L_{CD}$ between the principal component score vectors $P_n^D$ and $P_n^C$. Next, using the calculated vectors $L_{AD}$, $L_{BD}$, and $L_{CD}$, the prediction unit 54 selects two vectors closest to the vector $P_n^D$. Assume that $P_n^A$ and $P_n^B$ are selected. Then, an intra-lot variation pattern $\Delta D$ can be calculated as follows.

$$\Delta_D = \frac{L_{BD}\Delta_A + L_{AD}\Delta_B}{L_{AD} + L_{BD}} \quad (6)$$

According to the intra-lot variation pattern $\Delta D$, the prediction unit 54 calculates the machining dimension variation for each wafer of the lot and passes the calculated variation to the intra-lot process condition setting unit 56. The unit 56 refers to the recipe database 60 to calculate a quantity of correction of the process condition for each wafer and transmits an optimal process condition (recipe) of each wafer to the process controller 8. Having received the optimal recipe, the process controller 8 conducts the successive process for the lot.

In this way, the embodiment does not use the light emission spectra themselves but the principal component score vectors with a limited dimension. Therefore, the intra-lot variation pattern can be predicted without any adverse influence of disturbance of, for example, noise.

As described above, each of the embodiments of the present invention uses a fact that a correlation exists between a light emission spectral waveform obtained in the lot pre-stabilizing process and an intra-lot variation pattern of the machining dimension. Therefore, the embodiment can predict the variation pattern of the machining result in a lot before the intra-lot successive process. Also, according to a result from the prediction, the process condition can be optimized to obtain the machining result in a lot at a fixed level. That is, the optimal recipe can be determined for each wafer of the lot when the intra-lot successive process is started. Therefore, the intra-lot successive process can be controlled in a stable state and at a high speed. In the description of the method of the embodiment, a light emission spectrum is related to an intra-lot variation pattern using distance between vectors. However, various mathematical methods are also available for this purpose, and any one thereof may be used.

According to the present invention as described above, there are provided an apparatus and a method for processing a semiconductor capable of obtaining a process result at a fixed level even when the process result of the processing apparatus varies with a lapse of time.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A processing apparatus which performs a lot process in which a plurality of samples of a lot are successively processed in a process chamber, comprising:
    the process chamber;
    a sample stand to hold a sample in the process chamber;
    a process gas supply unit to supply a process gas to the process chamber;
    a state sensor programmed to detect a state in the process chamber during a lot pre-stabilizing process which is conducted prior to the lot process; and
    a process condition setting unit including:
        an intra-lot variation pattern database programmed to correspondingly store therein, sensor data candidates detectable by the state sensor during the lot pre-stabilizing process and corresponding intra-lot variation patterns;
        an intra-lot variation pattern prediction unit programmed to predict an intra-lot variation pattern of a lot to be processed next by referring to the intra-lot variation pattern database according to the sensor data detected by the state sensor, and to calculate a machining dimension variation for each sample of the lot to be processed next based on the predicted intra-lot variation pattern of a lot to be processed next; and
        an intra-lot process condition setting unit programmed to calculate a quantity of correction of a process condition for each sample of a lot to be processed next based on the machining dimension variation for each sample of the lot to be processed next calculated by the intra-lot variation pattern prediction unit prior to starting the lot process.

2. An apparatus according to claim 1, wherein the sensor data of the state sensor includes sensor data of spectra of light emission from plasma in the process chamber.

3. An apparatus according to claim 1, wherein when there is no intra-lot variation pattern corresponding to the sensor data detected by the state sensor within the intra-lot variation pattern database, the intra-lot variation pattern prediction unit is programmed to calculate a target intra-lot variation pattern in an intermediate state through interpolation using the intra-lot variation patterns of the intra-lot variation pattern database.

4. An apparatus according to claim 1, wherein:
    the intra-lot variation pattern prediction unit refers to the intra-lot variation pattern database and and is programmed to calculate the machining dimension variation for each sample of the lot to be processed next, prior to processing any sample of the lot to be processed next; and,
    the intra-lot process condition setting unit is programmed to calculate the quantity of correction of the process condition for each sample of the lot, prior to processing any sample of the lot to be processed next.

5. A processing apparatus configured to performs a lot process in which a plurality of samples of a lot are successively processed in a process chamber, comprising:
    the process chamber;
    a sample stand to hold a sample in the process chamber;
    a process gas supply unit to supply a process gas to the process chamber;
    a state sensor programmed to detect a state in the process chamber during a lot pre-stabilizing process conducted prior to the lot process; and
    a process condition setting unit including:
        an intra-lot variation pattern database programmed to correspondingly store therein sensor data candidates detectable by the state sensor during the lot pre-stabilizing process and corresponding intra-lot variation patterns;
        an intra-lot variation pattern prediction unit programmed to predict an intra-lot variation pattern of a lot to be processed next by referring to the intra-lot variation pattern database according to the sensor data detected by the state sensor, and to calculate a machining dimension variation for each sample of the lot to be processed next based on the predicted intra-lot variation pattern of the lot to be processed next;

a machining contour control recipe database programmed to store recipes to control machining contours; and an intra-lot process condition setting unit programmed to calculate a quantity of correction of a recipe for each sample of the lot to be processed next by referring to the machining contour control recipe database based on the machining dimension variation for each sample of the lot to be processed next calculated by the intra-lot variation pattern prediction unit.

6. An apparatus according to claim 5, wherein the sensor data of the state sensor includes sensor data of spectra of light emission from plasma in the process chamber.

7. An apparatus according to claim 5, wherein when there is no intra-lot variation pattern corresponding to the sensor data detected by the state sensor within the intra-lot variation pattern database, the intra-lot variation pattern prediction unit is programmed to calculate a target intra-lot variation pattern in an intermediate state through interpolation using the intra-lot variation patterns of the intra-lot variation pattern database.

8. An apparatus according to claim 5, wherein:

the intra-lot variation pattern prediction unit refers to the intra-lot variation pattern database and is programmed to calculate the machining dimension variation for each sample of the lot to be processed next, prior to processing any sample of the lot to be processed next; and, the intra-lot process condition setting unit is programmed to calculate the quantity of correction of the process condition for each sample of the lot, prior to processing any sample of the lot to be processed next.

* * * * *